United States Patent [19]

van de Polder et al.

[11] Patent Number: 4,472,734
[45] Date of Patent: Sep. 18, 1984

[54] TELEVISION PICK-UP ARRANGEMENT COMPRISING A SOLID STATE PICTURE PICK-UP DEVICE

[75] Inventors: Leendert J. van de Polder; Leonard J. M. Esser, both of Eindhoven, Netherlands

[73] Assignee: U.S. Philips Corp., New York, N.Y.

[21] Appl. No.: 361,998

[22] Filed: Mar. 25, 1982

[30] Foreign Application Priority Data

Apr. 16, 1981 [NL] Netherlands ............ 8101886

[51] Int. Cl.³ .................................. H04N 9/07
[52] U.S. Cl. ................................... 358/44
[58] Field of Search .................. 358/44, 41, 43, 48

[56] References Cited

U.S. PATENT DOCUMENTS

| | | | |
|---|---|---|---|
| 3,969,763 | 7/1976 | Tan | 358/44 |
| 4,237,477 | 12/1980 | Weimer | 358/44 |
| 4,288,812 | 9/1981 | Rhodes | 358/43 |

FOREIGN PATENT DOCUMENTS 33620  3/1979  Japan ............ 358/43

OTHER PUBLICATIONS

A Device Structure and Spatial Spectrum for Checker-Pattern CCD Color Camera, by S. Ochi et al., IEEE Transaction on Electron Devices, vol. ED-25, No. 2, Feb. 1978, pp. 261-266.

Primary Examiner—Tommy P. Chin
Attorney, Agent, or Firm—Thomas A. Briody; William J. Streeter; Charles E. Quarton

[57] ABSTRACT

A television pick-up arrangement comprising a solid-state picture pick-up device rows of picture pick-up elements of which are connectable to parallel inputs of two output shift registers. At a simultaneous read-out of the shift registers the registers supply at the series outputs picture signals associated with each pair of adjacent rows of picture pick-up elements. In the device the picture pick-up elements in one row are shifted in the row direction to the intermediate position relative to the elements in the other row. A color strip filter is provided having color filter strips transverse of the row direction which have a width equal to half the size in the row direction of a picture pick-up element. After the picture signal obtained from the registers are combined with the same polarity they are applied directly and via delay devices to inputs of a matrix circuit outputs of which are coupled to a change-over circuit from which color signals are obtained. Advantageous use can be made of a device in which pick-up information is obtained by use of both holes and electrons produced by photons.

5 Claims, 2 Drawing Figures

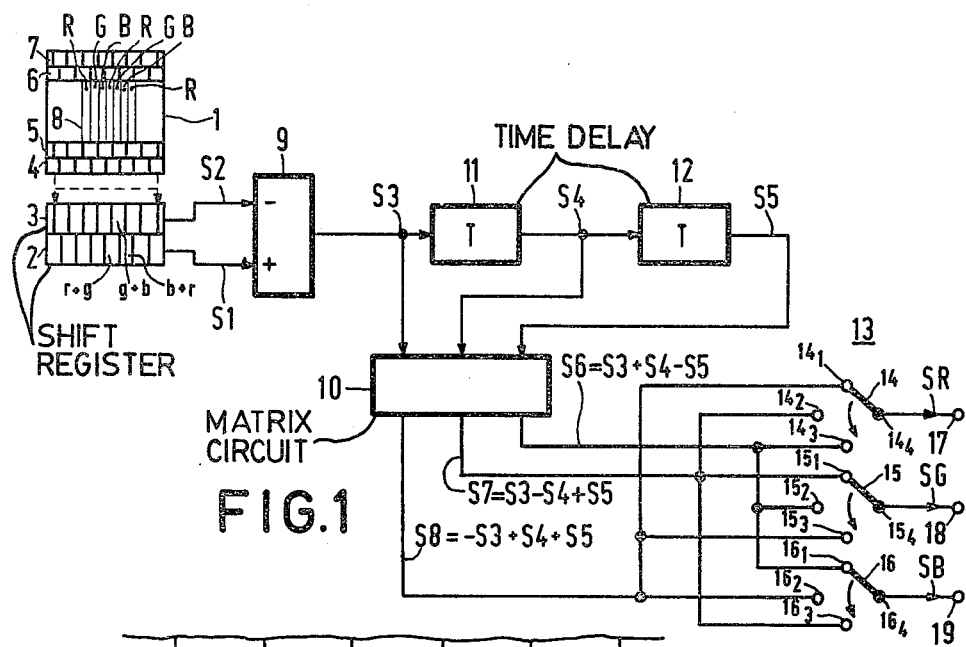
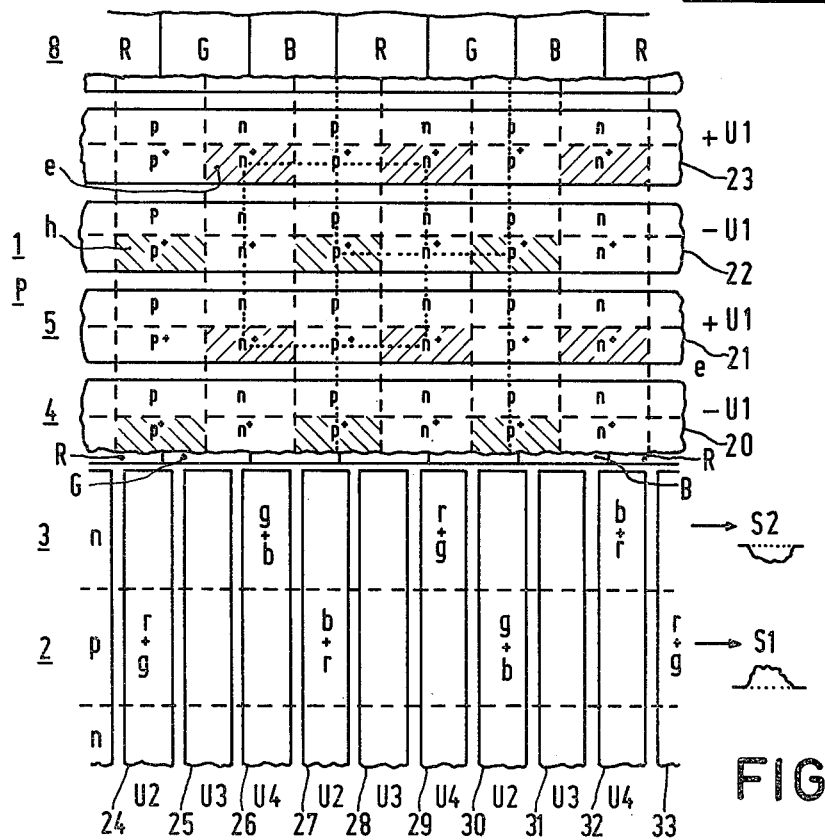

TELEVISION PICK-UP ARRANGEMENT COMPRISING A SOLID STATE PICTURE PICK-UP DEVICE

FIELD OF THE INVENTION

The invention relates to a television pick-up arrangement comprising a solid-state picture pick-up device having a bidimensional pattern of picture pick-up elements arranged in rows and columns in a semiconductor body, also comprising two output shift registers of the parallel-in, series-out type, parallel inputs of the two output shift registers being coupled to rows of picture pick-up elements and the series outputs carrying signals at a simultaneous read-out of the output shift registers.

DESCRIPTION OF THE PRIOR ART

In a known arrangement, the pick-up information associated with a row of picture pick-up elements and obtained after an information integration period, is stored in one of the output shift registers. After having been adjusted to the initial reference state the same row of picture pick-up elements is directly read again and the zero information (the integration period is so small as to be neglected, then present is stored in the other output shift register. Subsequent thereto the registers are simultaneously read in series and the information is applied to a superposition circuit in which a signal subtraction is performed. The zero information with only signal disturbances, such as they are, for example, caused by clock pulse signals, is substracted from the pick-up information with the same signal disturbances, so that the output of the superposition circuit supplies a signal containing only the pick-up information.

SUMMARY OF THE INVENTION

The invention has for its object to use such an arrangement comprising a solid-state picture pick-up device and two output shift registers coupled thereto for a completely different purpose than the above-described noise signal cancellation. According to the invention, the picture pick-up device of a specific construction and comprising the two output shift registers is combined in a special manner with a colour strip filter. A television pick-up arrangement in accordance with the invention is characterized in that at the simultaneous read-out of the output shift registers these registers supply as picture signals pick-up information associated with each pair of adjacent rows of picture pick-up elements, in each pair of adjacent rows of picture pick-up elements the picture pick-up elements in one row being shifted in the row direction to an intermediate position relative to the picture pick-up elements in the other row, a colour strip filter being present having filter strips which extend in the direction of the columns of the picture pick-up elements and have a width which is equal to half the distance between the centre point of the picture pick-up elements, the outputs of the output shift registers being coupled via delay devices having a time delay equal to half a register element shift period and to one register element shift period, respectively and directly to inputs of a series arrangement which includes a matrix circuit and a change-over circuit, outputs of the series arrangement being coupled to arrangement outputs for carrying colour signals.

A television pick-up arrangement in accordance with the invention employing simple signal processing, is characterized in that in the said series arrangement the matrix circuit is followed by the change-over circuit, a superposition circuit for combining with the same polarity the signals applied to it being arranged in the coupling between an input of the matrix circuit and a delay device input connected thereto to the outputs of the output shift registers.

A further simple embodiment is obtained by means of an arrangement which is characterized in that the filter strips of the colour strip filter are arranged in triplets in which the filter strips transmit light of a red, green and blue colour.

A television pick-up arrangement in accordance with the invention wherein the width of the colour filter strips is minimized by a dense packing of the picture pick-up elements, is characterized in that the solid-state picture pick-up device is of a type in which the rows of picture pick-up elements are alternately sequentially operative for picture information recording with picture information integration, caused by photons, by both electrons and holes in the semiconductor body.

A television pick-up arrangement in accordance with the invention has the additional advantage that it may be of a type which is integrated, at least predominantly in a semiconductor body.

BRIEF DESCRIPTION OF THE DRAWING

The invention will now be described in detail by way of example with reference to the accompanying drawing, in which FIG. 1 is a block schematic representation of an embodiment of a television pick-up arrangement in accordance with the invention, and FIG. 2 is a partly cut-away elevational view of a solid-state pick-up device comprising a colour strip filter and two output shift registers coupled thereto, particularly suitable for use in the television pick-up arrangement in accordance with the invention.

DESCRIPTION OF THE PREFERRED EMBODIMENTS

In FIG. 1, reference numeral 1 denotes a solid-state pick-up device and 2 and 3 denote two parallel-in, series-out output shift registers connected thereto. At the device 1 there are shown two pairs (4, 5) and (6, 7) of adjacent rows 4, 5 and 6, 7, respectively of picture pick-up elements. The picture pick-up elements are further arranged in columns in the device 1, the elements of the rows 4 and 6 having been shifted in the row direction to an intermediate position relative to those in the rows 5 and 7. A similarly shifted pattern is present for rows of elements, not shown, located between the rows 5 and 6. At the device 1, between the rows 5 and 6, the drawing shows a portion of a colour strip filter 8 having filter strips arranged in triplets and extending in the column direction, which transmit red light R, green light G and blue light B. At the device 1, which is fully covered by the strip filter 8, of FIG. 1 the drawing shows that the width of the filter strips R, G and B is half the size of a picture pick-up element in the row direction of the rows 4, 5, 6 and 7. This results in that each pick-up element receives light which contains two of the three primary colours red, green and blue. It being assumed that after a predetermined light integration period the pick-up information is transferred from the rows 4 and 5 of elements to the elements of the shift registers 2 and 3, respectively via the parallel inputs, FIG. 1 shows for some register elements that red and green information (r+g) is present in the register 2, green and blue information (g+b) in the register 3 and blue and red information (b+r) in the register 2. The foregoing description holds for the major part also for FIG. 2, which shows a more detailed elevational view of the device 1, the output shift registers 2 and 3 and the strip filter 8. In FIG. 2 it is further shown that the information (r+g), (g+b), respectively and (b+r), (r+g), respectively is present in the subsequent elements of the registers 3 and 2. When the registers 2 and 3 are red by means of clock pulse signals, not shown, said registers supply picture signals S1 and S2, which contain the said information. Compensation circuits for compensating for any differences in pick-up sensitivity or any phase shifts between the signals S1 and S1 with respect to the original location-dependence of the information may be connected to the outputs of the registers 2 and 3. In FIG. 2 it is shown that the signals S1 and S2 occur with opposite polarities, which is caused by the specific construction of the device 1 of FIG. 2, which will be further described hereinafter.

For simplicity of the description, let it be assumed that the register element connected to the output of the registers 2 and 3, respectively contains the information present at the beginning of the television line scan which is customary in television. The picture pick-up element in the row 4 which corresponds to the output register element of the register 2 then corresponds with the beginning of the field scan employed in television. Normally that scan starts, in the event of interlace being performed once every two field periods, in left top corner of the display screen, so that in the described construction of the device 1 the information present in the left-hand top corner in a scene to be televised is processed in the right-hand bottom corner in the device 1. For this purpose an inversing optic, not shown, may be arranged between the scene and the device 1. FIG. 1 shows some rows and columns of picture pick-up elements which in practice will amount to some hundreds, resulting in some hundreds of thousands of elements arranged in rows and columns.

The picture signal S1 containing, one after the other, the information (r+g), (g+b), (b+r) etc. in one cycle and the simultaneously read picture signal S2 containing, one after the other, the (negative) information (b+r), (r+g), (g+b) etc. in one cycle, are applied to a (+) and (−) input, respectively of a superposition circuit 9 in FIG. 1. As a result thereof the output of the circuit 9 carries a superposition signal S3 in which there are present, one after the other, the information (r+g), (b+r) (g+b) etc. in one cycle. In FIG. 1 the signal S3 is applied, to a first input of a matrix circuit 10 and to the input of a signal delay device 11. The ouput of the device 11 which carries a delayed signal S4 is connected to a second input of the matrix circuit 10 and to the input of a signal delay device 12, which has an output which carries a delayed signal S5 and is connected to a third input of the matrix circuit 10. The devices 11 and 12 have a time delay T equal to half the clock pulse period of the clock pulse signals by means of which the respective registers 2 and 3 are read, or put differently; T is equal to half the register element shifting period. Instead of with the series arrangement (11, 12) of the devices 11 and 12, the device 11 may alternatively be combined with a delay device connected to the output of the circuit 9 and having a time delay equal to 2T, i.e. once the register element shifting period. The result is that the signals S3, S4 and S5 of FIG. 1 contain information in a cycle (1, 2, 3) which can be derived from FIG. 2, for which it holds that:

$$S3=(g+b), S4=(b+r), S5=(r+g) \quad 1)$$

$$S3=(r+g), S4=(g+b), S5=(b+r) \quad 2)$$

$$S3=(b+r), S4=(r+g), S5=(g+b) \quad 3).$$

In the matrix circuit 10 those output signals for which it holds that: $S6=S3+S4-S5$, $S7=S3-S4+S5$ and $S8=-S3+S4+S5$ are formed from the signals S3, S4 and S5 applied to this matrix circuit. The three outputs of the matrix circuit 10 are connected to inputs of a change-over circuit 13 which comprises three change-over switches 14, 15 and 16 which each have three input terminals $14_1$, $14_2$, $14_3$; $15_1$, $15_2$, $15_3$ and $16_1$, $16_2$, $16_3$ and an output terminal $14_4$, $15_4$ and $16_4$. The output of the matrix circuit 10 carrying the signal S6, S7 and S8, respectively is connected to the input terminals $14_3$, $15_2$, $16_1$; $14_2$, $15_1$, $16_3$ and $14_1$, $15_3$, $16_2$, respectively. The switches 14, 15 and 16 switch under the control of a switching signal generator, not shown, the input terminals referenced $..._1$, $..._2$ and $..._3$ being connected to the output terminal referenced $..._4$ when the cycle (1, 2, 3) at the signals S3, S4 and S5 is present. So the change-over period is then equal to the time T and the cycling period is equal to 3T. In this cycle (1, 2, 3) it holds for the signals S6, S7 and S8 that $$S6=2b, S7=2g, S8=2r \quad 1)$$

$$S6=2g, S7=2r, S8=2b \quad 2)$$

$$S6=2r, S7=2b, S8=2g \quad 3),$$

causing in the cycle (1, 2, 3) the output terminals $14_4$, $15_4$ and $16_4$ to carry always the information 2r, 2g and 2b, which in FIG. 1 is indicated by means of the respective signals SR, SG and SB, which signals become available as colour signals for further processing at outputs 17, 18 and 19 of the arrangement.

Instead of the sequence shown in FIG. 1 in which the superposition circuit 9, the delay devices 11 and 12, the matrix circuit 10 and the change-over circuit 13 are arranged other sequences may alternatively be used. The only essential requirement to be satisfied is that the colour information (r+g), (g+b) and (b+r) must be present at the same instant to enable their change-over and matrixing. FIG. 1 shows the simplest embodiment.

Compared with prior pick-up arrangements in which the triplets of colour filter strips R, G and B normally cover three picture pick-up elements in the rows, the implementation described in the foregoing has the advantage that the triplets have only a width equal to the size of one and a half picture pick-up element. The reduction by a factor of two results in a higher resolution at signal recording and display, as now twice the number of colour strips is present at a given number of picture pick-up elements in a row. The R, G, B-choice then furnishes the advantage of the simplest signal processing in the matrix circuit 10 and the switching circuit 13, but instead of the basic colours R, G and B mixed colours may alternatively be chosen.

In the description of the arrangement shown in FIG. 1 no exact information is given in what manner the information picked up by two rows of picture pick-up elements ultimately arrives in the elements of the output shift registers 2 and 3. The transfer of information may be performed via storage elements, such as, for example, in the "inter line" or "frame transfer" reading method. Which reading method is used is not relevant to the invention.

FIG. 2 shows an embodiment of a solid-state picture pick-up device 1 which may advantageously be used in the arrangement shown in FIG. 1. The device 1 of FIG. 2 is of a type in which rows of picture pick-up elements are alternately sequentially operative for picture information by means of picture information integration, caused by photons, by means of both electrons (e) and holes (h) in a semiconductor body. FIG. 2 of the present application shows only information which is essential for understanding the invention. As shown in FIG. 2, the device 1 comprises a semiconductor body of p-type semiconductor material in which a comb of n-type material is formed, the teeth of the comb pointing into the column, i.e. the strip filter, direction and the cross-connection between the teeth being formed by the register 3. The register 2 is formed by a region of p-type semiconductor material of the semiconductor body bounded by regions of the n-type. In the teeth of the comb regions are formed with higher doped material of the n+-type, while in the regions of p-type material between the teeth higher doped regions of p+-type material are formed. Transparent, electrically conductive conductors 20, 21, 22 and 23, which are insulated from the semiconductor body are provided over the regions of p-type, n-type, p+-type and n+-type regions thus formed. A negative voltage −U1 and a positive voltage +U1, respectively, are applied to the conductors 20, 22 and 21, 23, respectively. The photons of the light which is incident through the colour filter strip R, G and B produce electrons e and holes h in the semiconductor regions which electrons e and holes h, respectively are pulled to the conductors (21 and 23) carrying the positive voltage +U$_1$ and to the conductors (22 and 22) carrying the negative voltage −U1, respectively and are stored in the higher doped n+ and p+-regions, respectively. The n+ and p+-regions form intermediate regions in picture pick-up element areas three of these regions being shown in FIG. 2 by means of dotted lines. From FIG. 2 it appears that in the two dotted consecutive areas with the n+ intermediate region (r+g) information is obtained because light is incident there via two colour filter strips R and G. For the dotted area having the p+ intermediate regions it follows that (b+r) information is obtained via two colour filter strips B and R. Considered with respect to the p+ and n+ regions, the condition must hold that the width of the filter strips R, G and B is equal to half the distance between the centre points of said regions.

At the output shift registers 2 and 3 of FIG. 2 reference numerals 24 through 33, inclusive denote conductors by means of which a charge transfer can be obtained when clock pulse voltages U2, U3 and U4 are applied in a three-phase structure.

After a predetermined light integration period, the registers 2 and 3 having been emptied completely, a charge transfer between the conductors may be obtained by reversing the polarity of the voltage U1 on the conductors 20, 21, 22 and 23. For the conductor 20 it holds that it must be supplied with, for example, a positive voltage higher than +U1, it then being guaranteed that the charge from the subjacent p+-region is shifted to the p-region under the conductors 24, 27, 30 and 33. Thereafter the charges coming from under the conductor 21, which are now in the n+-regions under the conductor 20 are transferred to the n-region under the conductors 26, 29 and 32. Thereafter, in the three-phase structure, the clock pulse voltages U2, U3 and U4 are applied, an information shift first occuring in the register 2, more specifically between the conductors carrying the voltages U2 and U2, whereafter a shift of information occurs in the register 3 between the conductors carrying the voltages U4 and U2. Thus, in one cycle the charges with the information are simultaneously shifted to an output, not shown in FIG. 2, of the registers 2 and 3, which results in the signals S1 and S2. At the three-phase structure of the registers 2 and 3 of FIG. 2 it is shown that the information is shifted from the input regions under the conductors to which the clock pulse voltages U2 and U4 are applied. At the output of the register 3 a circuit may be provided whereby the information from the register 3 is delayed so that this information is present in the signal S2 at instants located halfway between the instants at which the information is present in the signal S1. Herein, the period of time T is equal to half the register element shifting period.

The construction of a television pick-up arrangement according to the invention, as shown in FIG. 1, is suitable for integration in a semiconductor body, which is an advantage. Clock pulse circuits, not shown may also be integrated in the semiconductor body, shift signals being applied to the device 1, the output shift registers 2 and 3 and the delay devices 11 and 12 which are also in the form of analogue shift registers, and wherein furthermore change-over signals may be applied to the change-over circuit 13 and sample and -hold signals may be applied to the matrix circuit 10.

What is claimed is:

1. A television pick-up arrangement comprising a solid-state picture pick-up device having a bidimensional pattern of picture pick-up elements arranged in rows and columns in a semiconductor body, two output shift registers of the parallel-in, series-out type, parallel inputs of the two output shift registers being coupled to rows of picture pick-up elements and the series outputs carrying signals at a simultaneous read-out of the output shift registers, characterized in that at the simultaneous read-out of the output shift registers these registers supply as picture signals pick-up information associated with each pair of adjacent rows of picture pick-up elements, in each pair of adjacent rows of picture pick-up elements the picture pick-up elements in one row being shifted in a row direction to an intermediate position relative to the picture pick-up elements in the other row, a colour strip filter being present having filter strips which extend in the direction of the columns of the picture pick-up elements and have a width which is equal to the width of the picture pick-up elements, the outputs of the output shift registers being coupled via delay devices having a time delay equal to half a register element shift period and a time delay equal to a register element shift period, respectively and the output of the delay devices being coupled directly to inputs of a series arrangement which includes a matrix circuit and a change-over circuit, outputs of the series arrangement being coupled to outputs for supplying separate colour signals.

2. A television pick-up arrangement as claimed in claim 1, characterized in that in said series arrangement the matrix circuit is followed by the change-over circuit, a superposition circuit coupled to the outputs of the output shift registers for combining with the same polarity the signals applied thereto, an output of the superposition circuit being coupled to an input of the matrix circuit and an input of a delay device.

3. A television pick-up arrangement as claimed in claim 1 or 2, characterized in that the filter strips of the colour strip filter are arranged in triplets in which the filter strips transmit light of a red, green and blue colour.

4. A television pick-up arrangement as claimed in claim 1, characterized in that the solid state picture pick-up device is of a type in which the rows of picture pick-up elements are alternately sequentially operative for picture information recording with picture information integration, caused by photons, resulting from both electrons and holes in the semiconductor body.

5. A television pick-up arrangement as claimed in claim 1, which is integrated, at least predominantly, in a semiconductor body.

* * * * *